United States Patent
Yang et al.

(10) Patent No.: US 8,575,043 B2
(45) Date of Patent: Nov. 5, 2013

(54) SEMICONDUCTOR DEVICE AND MANUFACTURING METHOD THEREOF

(75) Inventors: Chan-Lon Yang, Taipei (TW); Tzu-Feng Kuo, Hsinchu (TW); Hsin-Huei Wu, Chiayi (TW); Ching-I Li, Tainan (TW); Shu-Yen Chan, Changhua County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 9 days.

(21) Appl. No.: 13/191,430

(22) Filed: Jul. 26, 2011

(65) Prior Publication Data

US 2013/0026543 A1    Jan. 31, 2013

(51) Int. Cl.
*H01L 21/00* (2006.01)
*B23K 26/02* (2006.01)
*B23K 26/08* (2006.01)

(52) U.S. Cl.
USPC .. 438/795; 438/799; 219/121.78; 219/121.79

(58) Field of Classification Search
USPC ................... 438/795–800; 219/121.6–121.86
See application file for complete search history.

(56) References Cited

U.S. PATENT DOCUMENTS

| | | | |
|---|---|---|---|
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,625,217 A | 4/1997 | Chau | |
| 5,777,364 A | 7/1998 | Crabbe | |
| 5,783,478 A | 7/1998 | Chau | |
| 5,783,479 A | 7/1998 | Lin | |
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |
| 6,110,787 A | 8/2000 | Chan | |
| 6,165,826 A | 12/2000 | Chau | |
| 6,165,881 A | 12/2000 | Tao | |
| 6,191,052 B1 | 2/2001 | Wang | |
| 6,228,730 B1 | 5/2001 | Chen | |
| 6,274,447 B1 | 8/2001 | Takasou | |
| 6,355,533 B2 | 3/2002 | Lee | |

(Continued)

OTHER PUBLICATIONS

O.Fujii, 2009 Symposium on VLSI Technology Digest of Technical Papers, "Sophisticated Methodology of Dummy Pattern Generation for Suppressing Dislocation Induced Contact Misalignment on Flash Lamp Annealed eSiGe Wafer", 2009.

(Continued)

*Primary Examiner* — Fernando L Toledo
*Assistant Examiner* — Karen Kusumakar
(74) *Attorney, Agent, or Firm* — Winston Hsu; Scott Margo

(57) ABSTRACT

A semiconductor device includes a plurality of active areas disposed on a semiconductor substrate. A manufacturing method of the semiconductor device includes performing a first annealing process on the semiconductor substrate by emitting a first laser alone a first scanning direction, and performing a second annealing process on the semiconductor substrate by emitting a second laser alone a second scanning direction. The first scanning direction and the second scanning direction have an included angle.

22 Claims, 6 Drawing Sheets

(56) References Cited

U.S. PATENT DOCUMENTS

| | | |
|---|---|---|
| 6,365,476 B1 | 4/2002 | Talwar |
| 6,368,926 B1 | 4/2002 | Wu |
| 6,429,100 B2* | 8/2002 | Yoneda ............ 438/487 |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,675,057 B2* | 1/2004 | Liu ............... 700/117 |
| 6,676,764 B2 | 1/2004 | Joo |
| 6,699,763 B2 | 3/2004 | Grider |
| 6,703,271 B2 | 3/2004 | Yeo |
| 6,747,245 B2* | 6/2004 | Talwar et al. ........... 219/121.8 |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting et al. |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2001/0029089 A1* | 10/2001 | Tanaka ............ 438/479 |
| 2001/0040541 A1* | 11/2001 | Yoneda et al. ............ 345/87 |
| 2002/0160553 A1* | 10/2002 | Yamanaka et al. ........... 438/149 |
| 2002/0160587 A1 | 10/2002 | Jagannathan |
| 2002/0182423 A1 | 12/2002 | Chu |
| 2003/0148594 A1* | 8/2003 | Yamazaki et al. ............ 438/487 |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0068908 A1* | 3/2007 | Grek et al. ............ 219/121.8 |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0210667 A1* | 9/2008 | Yang et al. .............. 219/121.6 |
| 2008/0220579 A1 | 9/2008 | Pal |
| 2008/0233722 A1 | 9/2008 | Liao |
| 2008/0233746 A1 | 9/2008 | Huang |
| 2008/0272097 A1* | 11/2008 | Bu et al. ............. 219/121.85 |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0278287 A1* | 11/2009 | Wang et al. ............ 264/485 |
| 2009/0302348 A1 | 12/2009 | Adam |
| 2010/0001317 A1 | 1/2010 | Chen |
| 2010/0084744 A1* | 4/2010 | Zafiropoulo et al. ......... 257/618 |
| 2010/0093147 A1 | 4/2010 | Liao |
| 2010/0187444 A1* | 7/2010 | Yang et al. .............. 250/492.2 |

OTHER PUBLICATIONS

T. Miyashita, IEDM, "A Study on Millisecond Annealing (MSA) Induced Layout Dependence for Flash Lamp Annealing (FLA and Laser Spike Annealing (LSA) in Multiple MSA Scheme with 45 nm High-Performance Technology", 2009.

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device and a manufacturing method thereof that uses lasers with different scanning directions in an annealing process to reduce thermal damage caused by the annealing process.

2. Description of the Prior Art

In the process of fabricating a semiconductor device, different dopants can be implanted in the semiconductor substrate in order to control the number of charge carriers. Different doped regions are thereby formed in the semiconductor device. For a variety of doping methods, such as ion implantation processing, liquid deposition processing, thermal diffusion processing, or chemical vapor deposition processing etc., an annealing process is required after the doped regions are formed in the semiconductor substrate. This relieves damage caused by the doping process and also activates dopants within the semiconductor substrate, which helps to reduce the resistance values of these dopants.

With the decreasing sizes of semiconductor devices and correspondingly increasing densities, doped regions have to achieve a higher quality standard. Therefore, annealing processes have to be completed in a shorter time. Conventionally, a rapid thermal process (RTP) is performed on semiconductor substrates for annealing. In the rapid thermal process, wafers are heated by an external heating source, such as tungsten lamps or halogen lamps etc. Laser annealing techniques have been considered to replace the rapid thermal process. Since a laser is capable of completing the annealing process in an extremely short time, the laser annealing process can advantageously form doped regions with shallower depths, so that the electrical performances of semiconductor devices can be improved.

In the laser annealing process, however, a high density power is imposed by the laser on the upper surface of a semiconductor substrate. As many devices made of different materials and having different layouts with different patterned densities are disposed on the upper surfaces of the semiconductor substrate, the laser annealing process may cause a temperature gradient along the longitudinal direction of the semiconductor substrate, leading to defects in the semiconductor substrate.

SUMMARY OF THE INVENTION

It is therefore one of the objectives of the present invention to provide a semiconductor device and a manufacturing method thereof to reduce the thermal damage caused by an annealing process.

In accordance with an embodiment of the present invention, a manufacturing method of a semiconductor device is provided as follows. First, a semiconductor substrate is provided. Then, a first annealing process is performed on the semiconductor substrate by emitting a first laser along a first scanning direction. A second annealing process is performed on the semiconductor substrate by emitting a second laser along a second scanning direction, wherein the first scanning direction and the second scanning direction have an included angle.

In accordance with another embodiment of the present invention, a different manufacturing method of a semiconductor device is provided as follows. A semiconductor substrate having a plurality of active areas is provided. In the semiconductor substrate, some of the long axes of the active areas are substantially parallel to a first direction, and the other long axes of the active areas are substantially parallel to a second direction, wherein the first direction is not parallel to the second direction. Next, a first annealing process is performed on the semiconductor substrate by emitting a first laser along a first scanning direction, wherein the first scanning direction and the first direction have an acute included angle.

Additionally, the present invention provides a semiconductor device including a plurality of active areas. All of the long axes of active areas are substantially parallel to an identical first direction, and the first direction is not parallel to a scanning direction of a laser used in an annealing process.

The manufacturing method of the semiconductor device using lasers with different scanning directions in an annealing process is able to reduce the thermal damage caused by annealing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
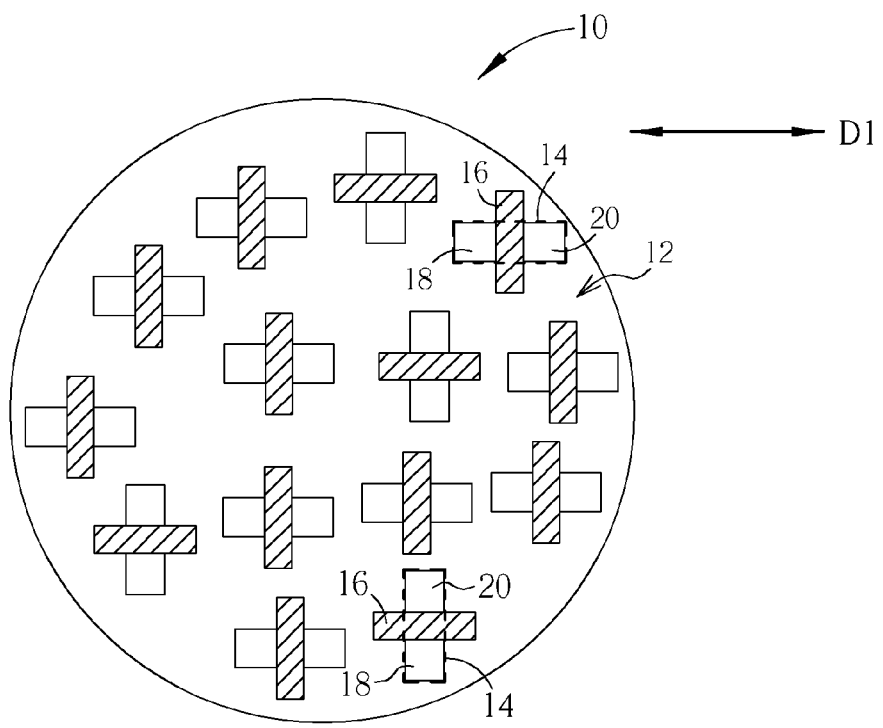
FIG. 1 through FIG. 4 are schematic diagrams illustrating a manufacturing method of a semiconductor device according to a first embodiment of the present invention.

Please refer to FIG. 1 through FIG. 4, which illustrate a manufacturing method of a semiconductor device according to a first embodiment of the present invention. In the present embodiment, the semiconductor device 10 is fabricated by the following steps. First, as shown in FIG. 1, a semiconductor substrate 12 including a plurality of active areas 14 is provided. Each of the active areas 14 is substantially designed with rectangle shapes, and has a long axis and a short axis. Each of the active areas 14 includes a doped source region 18, and a doped drain region 20. More than half of the long axes of the active areas 14 disposed in the semiconductor substrate 12 are substantially parallel to a first direction D1. Additionally, each of the active areas 14 includes a gate 16 disposed thereon, and the gate 16 overlaps the active area 14 and is substantially parallel to the short axis.

Figure 2:
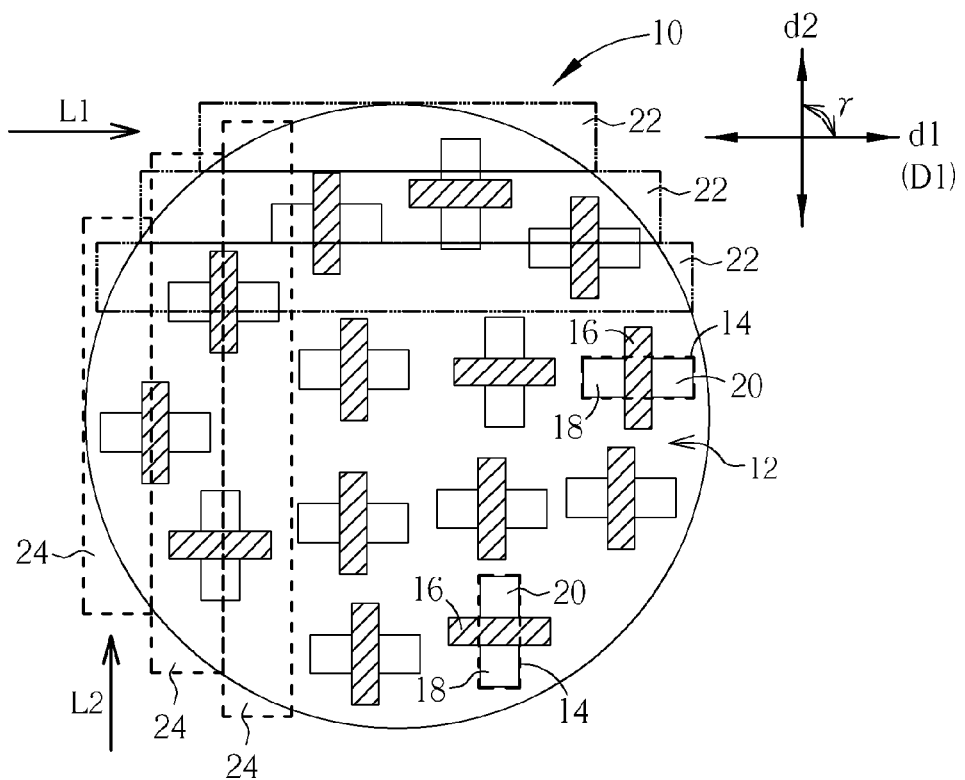

Next, as shown in FIG. 2, a first annealing process is performed on the semiconductor substrate 12 by emitting a first laser L1 along a first scanning direction d1, which is substantially parallel to the first direction D1; and a second annealing process is also performed on the semiconductor substrate 12 by emitting a second laser L2 along a second scanning direction d2. In the present embodiment, the first scanning direction d1 and the second scanning direction d2 have an included angle γ, for example, 90 degrees, but is not limited thereto. In the present embodiment, the first laser L1 and the second laser L2 can be the same type (emitting light with the same wavelength). Moreover, the first laser L1 scans along a plurality of first scanning paths 22, which are substantially parallel to the first scanning direction d1 and cover the whole surface area of the semiconductor substrate 12. The semiconductor substrate 12 is thereby completely scanned. It should be noted that in the present embodiment, adjacent first scanning paths 22 scan along the first scanning direction d1 from different sides, for instance, the Nth first scanning path 22 scans from left to right, and the (N+1)th first scanning path 22 scans from right to left. Thus, the first scanning paths 22 can be scanned with a continuous trajectory. Similarly, the second laser L2 scans along a plurality of second scanning paths 24, which are substantially parallel to the second scanning direction d2 and cover the whole surface area of the semiconductor substrate 12. Also, adjacent second scanning paths 24 scan along the second scanning direction d2 from different sides, for instance, the Nth second scanning path 24 scans from top to bottom, and the (N+1)th first scanning path 22 scans from bottom to top. In the present embodiment, the adjacent first scanning paths 22 do not overlap each other, and the adjacent second scanning paths 24 do not overlap each other. Additionally, in the present embodiment, the second laser L2 scans after the whole first scanning paths 22 are completely scanned by the first laser L1, but is not limited thereto, the whole second scanning paths 24 can be completely scanned by the second laser L2 before the first laser L1 scans. Such that the area covered by all of the first scanning paths 22 and the second scanning paths 24 completely overlaps the surface area of the semiconductor substrate 12.

Figure 3:
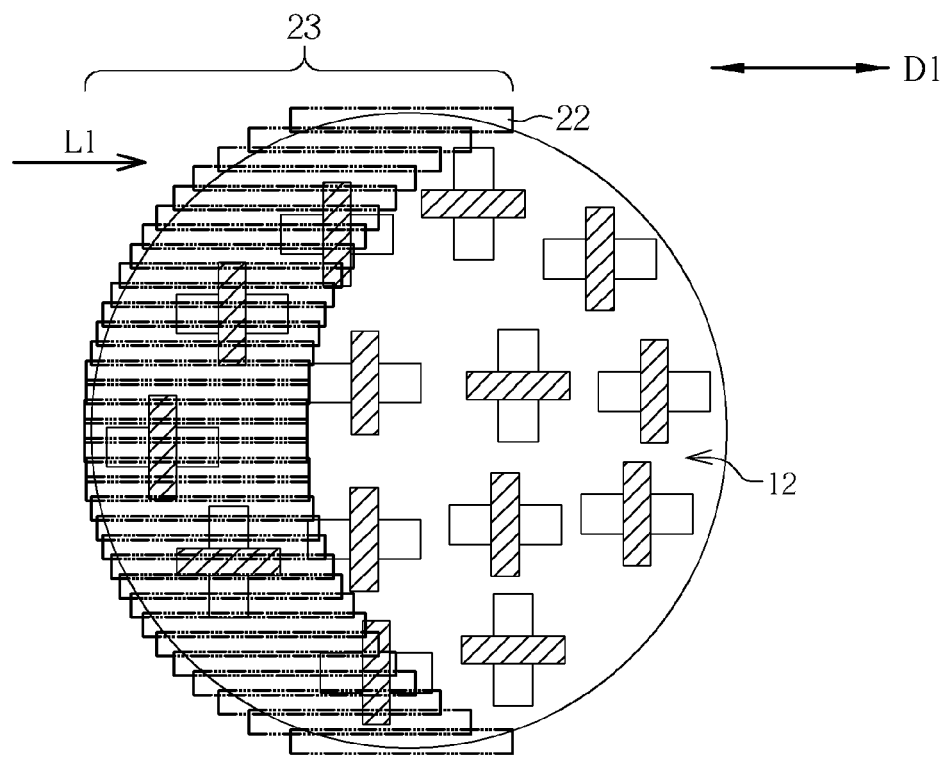

In the present invention, the edges of the first scanning paths 22 and the second scanning paths 24 can also be respectively arranged with an arc shape along the edge of the semiconductor substrate 12. As shown in FIG. 3, the first annealing process, for example, can be divided into a plurality of scanning cycles 23 to completely scan the surface area of the semiconductor substrate 12. Each of the scanning cycles 23 includes a plurality of first scanning paths 22, and adjacent first scanning paths 22 are not located at the same vertical position, and adjacent first scanning paths 22 shift along the first direction D1. Therefore, in a scanning cycle 23, the edges of all of the first scanning paths 22 are arranged with an arc shape.

Figure 4:
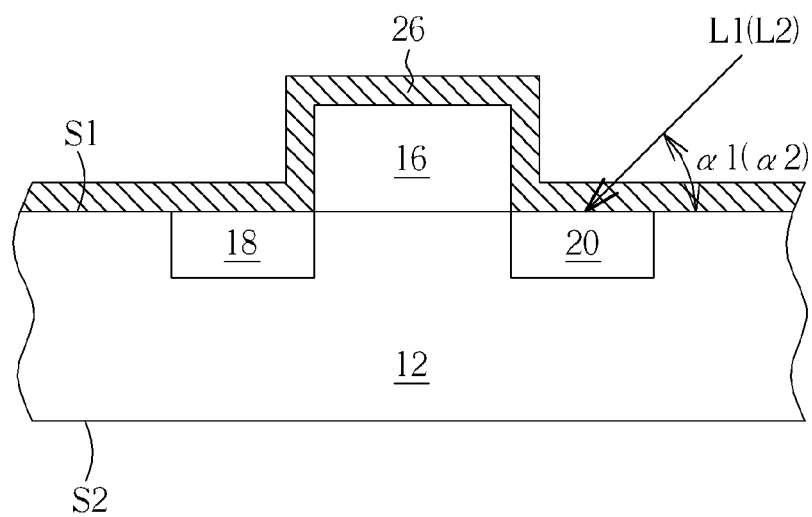

As shown in FIG. 4, the semiconductor substrate 12 includes an upper surface S1 and a lower surface S2. The first laser L1 and the upper surface S1 of the semiconductor substrate 12 have an incident angle $\alpha 1$ substantially lying between 0 and 90 degrees, preferable with Brewster angle, and the second laser L2 and the upper surface S1 of the semiconductor substrate 12 have an incident angle $\alpha 2$ substantially lying between 0 and 90 degrees, preferable with Brewster angle. The incident angle $\alpha 1$ and $\alpha 2$ are preferably set as acute angles, but the incident angles $\alpha 1$ and $\alpha 2$ are not limited to be the same. Since the first annealing process and the second annealing process are only performed on the upper surface S1 of the semiconductor substrate 12 by respectively emitting the first laser L1 and the second laser L2, a temperature difference is generated between the upper surface S1 and the lower surface S2 of the semiconductor substrate 12. Accordingly, in the present embodiment, the manufacturing method of the semiconductor device 10 can further include a step of performing a back-side heating process on the semiconductor substrate 12 during the annealing processes to reduce the temperature difference between the upper surface S1 and the lower surface S2 of the semiconductor substrate 12, so as to avoid defects being caused by a temperature difference. For instance, a flash light (not shown) can be used to heat the lower surface S2 of the semiconductor substrate 12, but is not limited thereto. In addition, as shown in FIG. 3, a sacrificial layer 26 can also be selectively formed on the semiconductor substrate 12 before the annealing processes are performed to reduce the differences in refractive index and reflective index of the upper surface S1 of the semiconductor substrate 12, such that the annealing process would not cause huge differences in thermal effects in different regions of semiconductor substrate 12 due to different material and pattern distributions. Finally, the sacrificial layer 26 can be removed after the annealing process is accomplished.

In the present embodiment, it should be appreciated that more than half of the long axes of the active areas 14 in the semiconductor substrate 12 are substantially parallel to the first direction D1; therefore, when the first annealing process is performed along the first direction D1, the first laser L1 emitted toward the semiconductor substrate 12 would lead to serious thermal damage. Accordingly, in the present embodiment, the first laser L1 is utilized with lower power so that the first annealing process has a lower first temperature and thermal damage to the semiconductor substrate 12 can be reduced. In the second annealing process, the second scanning direction d2 is not parallel to the first direction D1, and the second scanning direction d2 and the first direction D1 have the included angle γ: for example, 90 degrees. As a result, the second laser L2 leads to smaller thermal damage to the semiconductor substrate 12 during the second annealing process. Accordingly, the second laser L2 can be utilized with higher power, so that the second annealing process has a higher second temperature to enhance the annealing performance.

Figure 5:
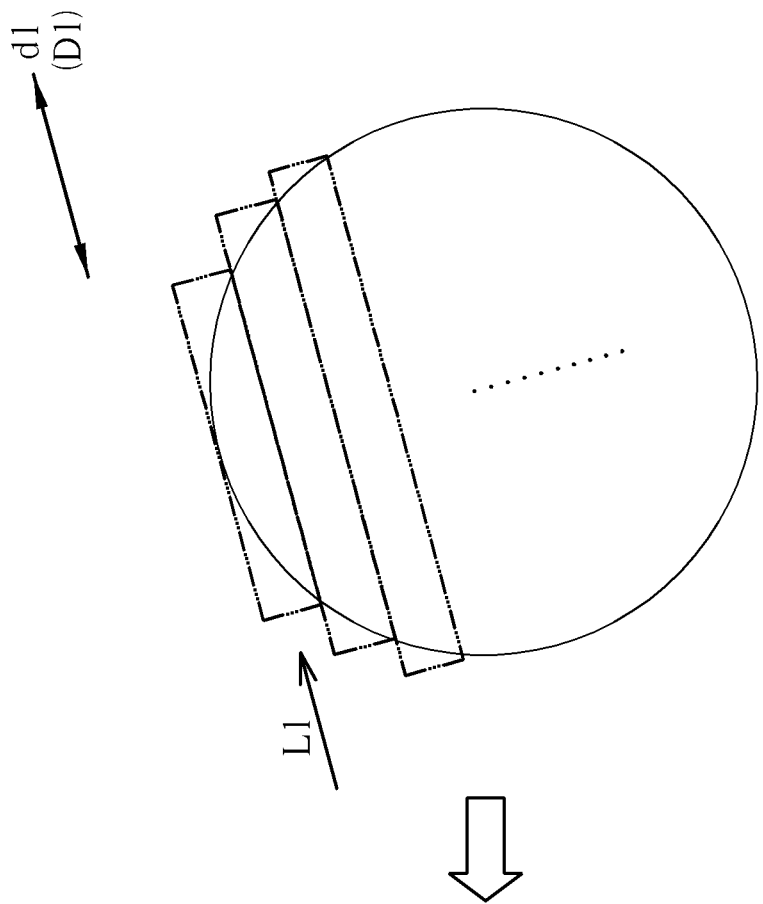
FIG. 5 and FIG. 6 are schematic diagrams illustrating warpage deformations of the semiconductor device according to the first embodiment of the present invention.
Figure 5:
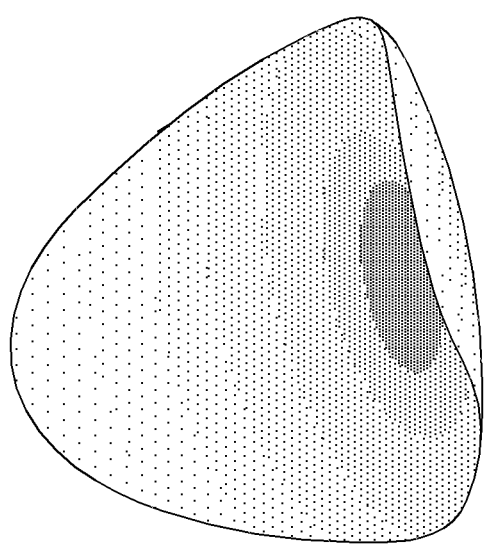
Figure 6:
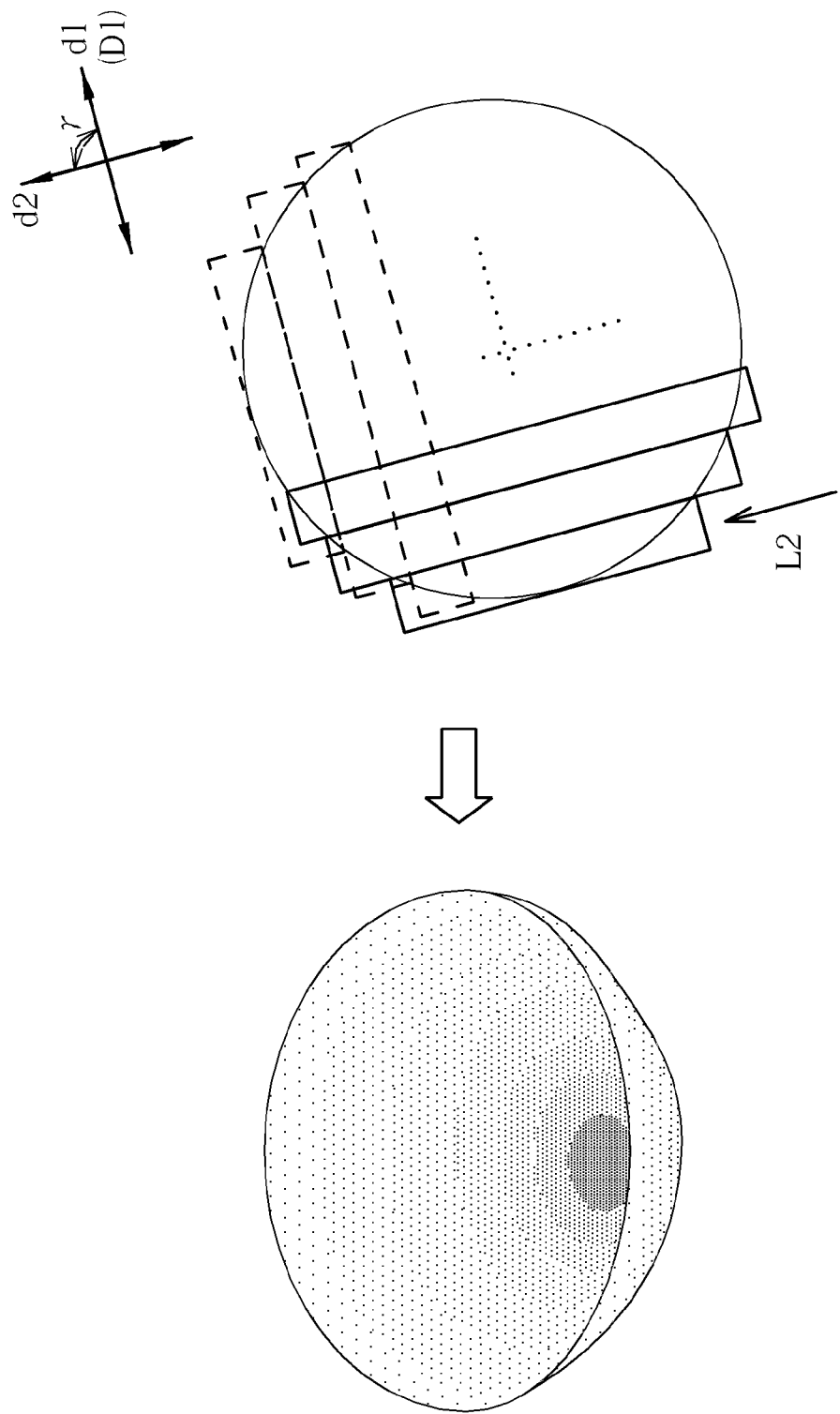

Please refer to FIG. 5 and FIG. 6, which illustrate warpage deformations of the semiconductor device according to the first embodiment of the present invention. In the present embodiment, various stressed regions, epitaxial layers, and doped regions are respectively disposed in each active area 14 in the semiconductor substrate 12. Therefore, thermal stresses generated in annealing processes may cause defects such as dislocation loops. Accordingly, as shown in the right part of FIG. 5, the first laser L1 scans the semiconductor substrate 12 along the second scanning direction d2, after the semiconductor substrate 12 is completely scanned by the first laser L1, the semiconductor substrate 12 would be deformed into a warpage deformation along a direction substantially perpendicular to the first direction D1, as shown in the left part of FIG. 5. Next, as shown in the right part of FIG. 6, the second laser L2 scans the semiconductor substrate 12 along the second scanning direction d2, after semiconductor substrate 12 is completely scanned by the second laser L2, as shown in the left part of FIG. 6, the semiconductor substrate 12 would be deformed into a warpage deformation along a direction substantially parallel to the first direction D1. Therefore, after being completely scanned by the first laser L1 and the second laser L2, the semiconductor substrate 12 is deformed into a symmetric warpage deformation instead of an asymmetric deformation curved like a potato chip caused by a laser scanning along a single direction. Moreover, after the first annealing process and the second annealing process are performed, all active areas 14 in the semiconductor substrate 12 can be completely scanned twice so as to enhance annealing performance.

Figure 7:
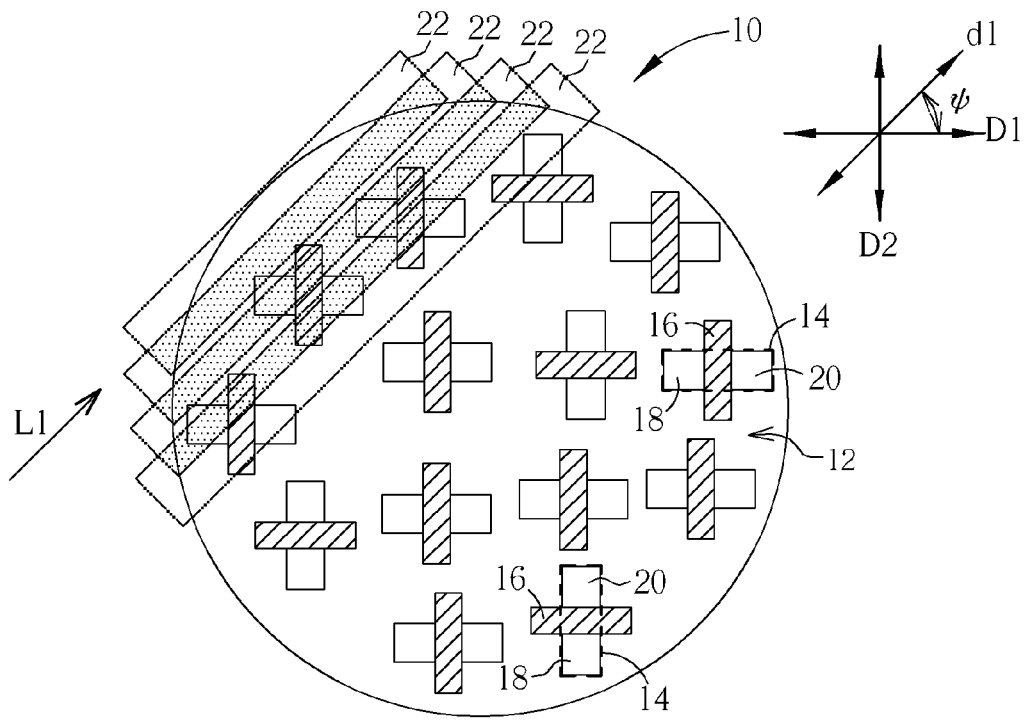
FIG. 7 and FIG. 8 are schematic diagrams illustrating a manufacturing method of a semiconductor device according to a second embodiment of the present invention.
Figure 8:
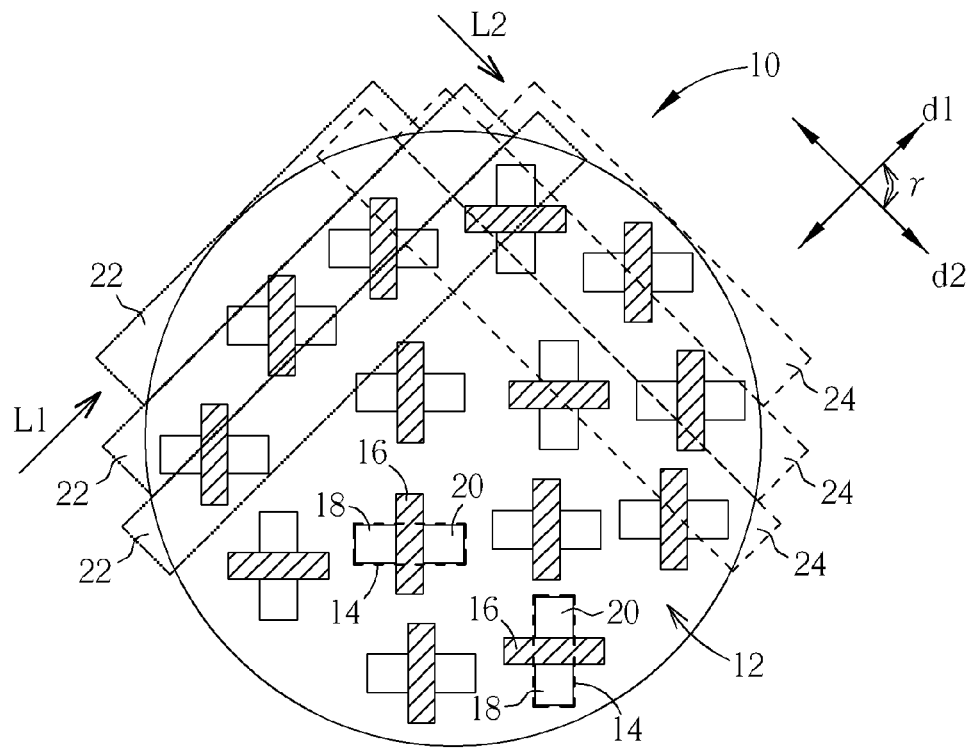

Please refer to FIG. 7 and FIG. 8, which illustrate a manufacturing method of semiconductor device according to a second embodiment of the present invention. For clear illustration, the same components are denoted by the same numerals in the present embodiment as compared with the aforementioned embodiment. As shown in FIG. 7, a semiconductor substrate 12 including a plurality of active areas 14 is provided, and each of the active areas 14 has a long axis. In the semiconductor substrate 12, a portion of the long axes of the active areas 14 are substantially parallel to a first direction D1, and the other portion of the axes of the active areas 14 are substantially parallel to a second direction D2, and the first direction D1 is not parallel to the second direction D2. In the present embodiment, the first direction D1 is substantially perpendicular to the second direction D2, but is not limited thereto. Next, a first annealing process is performed on the semiconductor substrate 12 by emitting a first laser L1 along a first scanning direction d1. The first scanning direction d1 and the first direction D2 have an acute included angle ψ. In the present embodiment, the acute included angle ψ is approximately 45 degrees, but is not limited thereto. Additionally, in the present embodiment, the first laser L1 scans along a plurality of first scanning paths 22, and each first scanning path 22 is approximately 50 percent overlapped by the adjacent first scanning path 22, so that all of the active areas 14 in the semiconductor substrate 12 can be completely scanned twice to enhance annealing performance.

As previously mentioned, a laser scanning along a single direction in an annealing process possibly causes an asymmetric deformation curved like a potato chip of the semiconductor substrate 12. Accordingly, the second embodiment of the present invention provides another variant embodiment. As shown in FIG. 8, after the first annealing process is performed by emitting a first laser L1 along a first scanning direction d1, a second annealing process is further performed on the semiconductor substrate 12 by emitting a second laser L2 along a second scanning direction d2. The second scanning direction d2 and the first scanning direction d1 have an included angle γ. In this variant embodiment, the included angle γ between the second scanning direction d2 and the first scanning direction d1 is approximately 90 degrees, but is not limited thereto. It should be noted that the first laser L1 and the second laser L2 respectively scan along a plurality of first scanning paths 22 and a plurality of second scanning paths 24. Each first scanning path 22 is not overlapped by the adjacent first scanning path 22, and each second scanning path 24 is not overlapped by the adjacent second scanning path 24. As mentioned in the first embodiment of the present invention, in the present embodiment, adjacent first scanning paths 22 scan along the first scanning direction d1 from different sides, and also adjacent second scanning paths 24 scan along the second scanning direction d2 from different sides. Moreover, the edges of the first scanning paths 22 and the second scanning paths 24 can also be respectively arranged with an arc shape along the edge of the semiconductor substrate 12, such that the area covered by all of the first scanning paths 22 and the second scanning paths 24 completely overlaps the surface area of the semiconductor substrate 12. In this variant embodiment, the semiconductor substrate 12 is deformed into a symmetric warpage deformation by the first laser L1 and the second laser L2 scanning along different directions respectively. Moreover, after the first annealing process and the second annealing process are performed, all of the active areas 14 in the semiconductor substrate 12 can be completely scanned twice so as to enhance the annealing performance.

In accordance with the second embodiment of the present invention, as shown in FIG. 7, the semiconductor substrate 12 includes an upper surface S1 and a lower surface S2. The first laser L1 and the upper surface S1 of the semiconductor substrate 12 have an incident angle α1 substantially lying between 0 and 90 degrees, preferable with Brewster angle, and the second laser L2 and the upper surface S1 of the semiconductor substrate 12 have an incident angle α2 substantially lying between 0 and 90 degrees, preferable with Brewster angle. The incident angles α1 and α2 are preferably set as acute angles, but the incident angles α1 and α2 are not limited to be the same. Similar to the aforementioned embodiment, the manufacturing method of the semiconductor device 10 according to the present embodiment can include a step of performing a back-side heating process on the semiconductor substrate 12 during the annealing processes, and also a sacrificial layer 26 can be selectively formed on the semiconductor substrate 12 before the annealing processes are performed to reduce the differences in refractive index and reflective index of the upper surface S1 of the semiconductor substrate 12, such that the annealing process would not cause huge differences in thermal effects of different regions of semiconductor substrate 12 due to different material and pattern distributions. Finally, the sacrificial layer 26 can be removed after the annealing process is accomplished.

Figure 9:
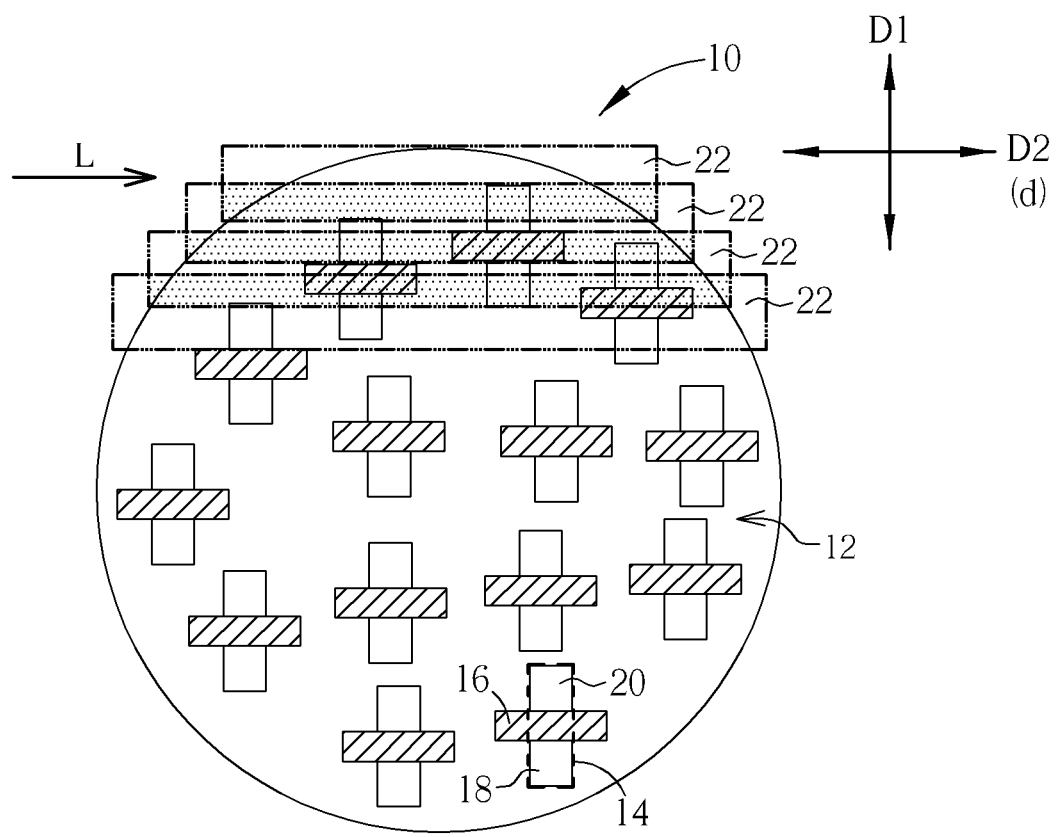
FIG. 9 is a schematic diagram illustrating a semiconductor device according to a third embodiment of the present invention.

In accordance with the second embodiment of the present invention, as shown in FIG. 7 and FIG. 8, the long axes of the active areas 14 are substantially parallel to either the first direction D1 or the second direction D2, which is perpendicular to the first direction D1. In the first annealing process, the first laser L1 scans along the first scanning direction d1, and the first scanning direction d1 and the first direction D1 have the acute included angle ψ of approximately 45 degrees, so the first scanning direction d1 and the second direction D1 also have the same included angle of approximately 45 degrees. In the second annealing process, the second laser L2 scans along the second scanning direction d2, and the second scanning direction d2 and the first scanning direction d1 have the included angle γ of approximately 90 degrees. Accordingly, the second scanning direction d2 and the second direction D1 have an included angle of approximately 135 degrees, and also the second scanning direction d2 and the second direction D2 have the same included angle of approximately 135 degrees. As a result, only partial power of the first laser L1 and the second laser L2 attacks the long axes of the active areas 14 substantially parallel to the first direction D1 and the second direction D2, and the semiconductor substrate 12 will not be seriously damaged during the annealing processes Please refer to FIG. 9, which illustrates a semiconductor device according to a third embodiment of the present invention. For clear illustration, the same components are denoted by the same numerals in the present embodiment as compared with the aforementioned embodiment. As shown in FIG. 9, a plurality of active areas 14 are disposed in the semiconductor substrate 12, and each active area 14 includes, a doped source region 18 and a doped drain region 20. Additionally, each of the active areas 14 includes a gate 16 disposed thereon, and the gate 16 overlaps the active area 14 and is substantially parallel to the short axis. In the present embodiment, all of the long axes of the active areas 14 are substantially parallel to an identical first direction D1, which is not parallel to a scanning direction d of a laser L. In the present embodiment, the second direction D2 and the first direction D1 are substantially perpendicular to each other, but the invention is not limited thereto. According to the initial layout design (design rule) in the present embodiment, the long axes of all active areas 14 are limited to parallel to the identical first direction D1, and the laser L is emitted along the scanning direction d, which is perpendicular to the first direction D1 and also substantially parallel to the second direction D2, for performing an annealing process on the semiconductor substrate 12. Therefore, the thermal damage generated on the long axes of the active areas 14 substantially parallel to the first direction D1 can be reduced during the annealing process.

To sum up, according to the present invention, the manufacturing method of the semiconductor device uses lasers with different scanning directions in the annealing process, which enhances the annealing performance, and reduces the thermal damage to the semiconductor substrate during the annealing process. The laser annealing processes provided in the present invention can be applied for various heat treatments such as stress memorization techniques (SMT), source/drain annealing, salicidation, and re-crystallization.

Those skilled in the art will readily observe that numerous modifications and alterations of the device and method may be made while retaining the teachings of the invention.

What is claimed is:

1. A manufacturing method of semiconductor device, comprising:
    providing a semiconductor substrate;
    performing a first annealing process on the semiconductor substrate by emitting a first laser along a first scanning direction; and
    performing a second annealing process on the semiconductor substrate by emitting a second laser along a second scanning direction, wherein the first scanning direction and the second scanning direction have an included angle,
wherein, the first laser scans along a plurality of first scanning paths in a linear discrete fashion, the first scanning paths have edges arranged with an arc shape, such that the area covered by all of the first scanning paths completely overlaps the surface area of the semiconductor substrate, the second laser scans along a plurality of second scanning paths in a linear discrete fashion, and the second scanning paths have edges arranged with an arc shape, such that the area covered by all of the second scanning paths completely overlaps the surface area of the semiconductor substrate.

2. The manufacturing method of semiconductor device according to claim 1, wherein the first annealing process has a first temperature, the second annealing process has a second temperature, and the first temperature is substantially smaller than the second temperature.

3. The manufacturing method of semiconductor device according to claim 1, wherein the semiconductor substrate comprises a plurality of active areas, and each of the active areas has a long axis, the first scanning direction in the first annealing process is substantially parallel to a first direction, wherein more than half of the long axes of the active areas are substantially parallel to the first direction.

4. The manufacturing method of semiconductor device according to claim 1, wherein the included angle is approximately 90 degrees.

5. The manufacturing method of semiconductor device according to claim 1, wherein the first laser and a surface of the semiconductor substrate have an incident angle substantially lying between 0 and 90 degrees, preferable with Brewster angle.

6. The manufacturing method of semiconductor device according to claim 1, wherein the second laser and a surface of the semiconductor substrate have an incident angle substantially lying between 0 and 90 degrees, preferable with Brewster angle.

7. The manufacturing method of semiconductor device according to claim 1, further comprising a step of performing a back-side heating process of the semiconductor substrate during the annealing processes.

8. The manufacturing method of semiconductor device according to claim 1, further comprising a step of forming a sacrificial layer on the semiconductor substrate before performing the annealing processes.

9. A manufacturing method of semiconductor device, comprising:
    providing a semiconductor substrate, comprising a plurality of active areas, and each of the active areas has a long axis, wherein a portion of the long axes of the active areas are substantially parallel to a first direction, and the other portion of the long axes of the active areas are substantially parallel to a second direction, and the first direction is not parallel to the second direction;
    performing a first annealing process on the semiconductor substrate by emitting a first laser along a first scanning direction, wherein the first scanning direction and the first direction have an acute included angle when viewed in top view; and
    performing a second annealing process on the semiconductor substrate by emitting a second laser along a second scanning direction, wherein the second scanning direction and the first scanning direction have an included angle when viewed in top view.

10. The manufacturing method of semiconductor device according to claim 9, wherein the first direction and the second direction are substantially perpendicular to each other.

11. The manufacturing method of semiconductor device according to claim 9, wherein the acute included angle is approximately 45 degrees.

12. The manufacturing method of semiconductor device according to claim 9, wherein the first laser scans along a plurality of first scanning paths.

13. The manufacturing method of semiconductor device according to claim 12, wherein each first scanning path is approximately 50 percent overlapped by the adjacent first scanning path.

14. The manufacturing method of semiconductor device according to claim 12, wherein the first scanning paths have edges arranged with an arc shape, such that the area covered by all of the first scanning paths completely overlaps the surface area of the semiconductor substrate.

15. The manufacturing method of semiconductor device according to claim 9, wherein the first laser and a surface of the semiconductor substrate have an incident angle substantially lying between 0 and 90 degrees, preferable with Brewster angle.

16. The manufacturing method of semiconductor device according to claim 9, wherein the included angle is approximately 90 degrees.

17. The manufacturing method of semiconductor device according to claim 9, wherein the first laser scans along a plurality of first scanning paths, and the second laser scans along a plurality of second scanning paths.

18. The manufacturing method of semiconductor device according to claim 17, wherein the adjacent first scanning paths do not overlap each other, and the adjacent second scanning paths do not overlap each other.

19. The manufacturing method of semiconductor device according to claim 17, wherein the second scanning paths have edges arranged with an arc shape, such that the area covered by all of the second scanning paths completely overlaps the surface area of the semiconductor substrate.

20. The manufacturing method of semiconductor device according to claim 9, wherein the second laser and the surface of the semiconductor substrate have an incident angle substantially lying between 0 and 90 degrees, preferable with Brewster angle.

21. The manufacturing method of semiconductor device according to claim 9, further comprising a step of performing a back-side heating process of the semiconductor substrate during the annealing processes.

22. The manufacturing method of semiconductor device according to claim 9, further comprising a step of forming a sacrificial layer on the semiconductor substrate before performing the first annealing processes.

* * * * *